(12) United States Patent
Dement

(10) Patent No.: US 9,784,776 B2
(45) Date of Patent: Oct. 10, 2017

(54) LOGICAL TRIGGERING IN THE FREQUENCY DOMAIN

(71) Applicant: Tektronix, Inc., Beaverton, OR (US)

(72) Inventor: John A. Dement, Waldorf, MD (US)

(73) Assignee: Tektronix, Inc, Beaverton, OR (US)

( * ) Notice: Subject to any disclaimer, the term of this patent is extended or adjusted under 35 U.S.C. 154(b) by 0 days.

(21) Appl. No.: 14/017,111

(22) Filed: Sep. 3, 2013

(65) Prior Publication Data

US 2014/0012526 A1    Jan. 9, 2014

Related U.S. Application Data

(63) Continuation of application No. 12/774,648, filed on May 5, 2010, now abandoned.

(51) Int. Cl.
*G01R 23/16* (2006.01)
*G01R 23/165* (2006.01)
(Continued)

(52) U.S. Cl.
CPC .......... *G01R 23/16* (2013.01); *G01R 23/165* (2013.01); *G01R 13/0245* (2013.01);
(Continued)

(58) Field of Classification Search
CPC ...... G01R 23/16; G01R 29/02; G01R 23/163; G01R 23/165; G01R 27/28; G01R 23/167;
(Continued)

(56) References Cited

U.S. PATENT DOCUMENTS 5,103,402 A    4/1992  Morton et al.
7,142,996 B2 *  11/2006 Patel ................... G01R 31/3004
                                                      702/64
(Continued)

FOREIGN PATENT DOCUMENTS

CN    1725024 A    1/2006
CN    1727907 A    2/2006
(Continued)

*Primary Examiner* — Sujoy Kundu
*Assistant Examiner* — L. Anderson
(74) *Attorney, Agent, or Firm* — Marger Johnson; Kevin Dothager

(57) ABSTRACT

A frequency mask trigger capable of triggering based on a logical combination of two or more areas of a frequency mask transforms a frame of digital data representing an input signal into a frequency spectrum having a plurality of frequency bins, with each frequency bin having a power amplitude value. A frequency mask is defined having a plurality of reference power levels, one reference power level being associated with each frequency bin. Two or more areas of the frequency mask are defined, with each mask area corresponding to one or more of the frequency bins. A violation status is determined for each mask area by comparing all of the power amplitude values within each mask area to the associated reference power level. If any of the power amplitude values within the mask area violates the associated reference power level, then the entire mask area is deemed to be violated. A trigger signal is generated when a logical combination of the violation statuses of the mask areas is satisfied.

16 Claims, 3 Drawing Sheets

(51) Int. Cl.
  *G01R 13/02*     (2006.01)
  *G01R 13/34*     (2006.01)
  *G01R 23/163*    (2006.01)
  *H04B 17/00*     (2015.01)
  *G01R 23/167*    (2006.01)
  *H04B 17/327*    (2015.01)

(52) U.S. Cl.
  CPC .......... *G01R 13/345* (2013.01); *G01R 23/163* (2013.01); *G01R 23/167* (2013.01); *H04B 17/0085* (2013.01); *H04B 17/327* (2015.01)

(58) Field of Classification Search
  CPC .............. G01R 13/0245; G01R 13/345; G06G 7/1921; H04B 17/0045; H04B 17/327; H04B 17/0085
  See application file for complete search history.

(56) References Cited

U.S. PATENT DOCUMENTS

| | | |
|---|---|---|
| 7,759,925 B2 | 7/2010 | Nara |
| 2010/0204938 A1 | 8/2010 | Hillman et al. |

FOREIGN PATENT DOCUMENTS

| | | |
|---|---|---|
| CN | 101495873 A | 7/2009 |
| CN | 102012457 A | 4/2011 |
| JP | 2006-162435 A | 6/2006 |
| JP | 2008026188 A | 2/2008 |

\* cited by examiner

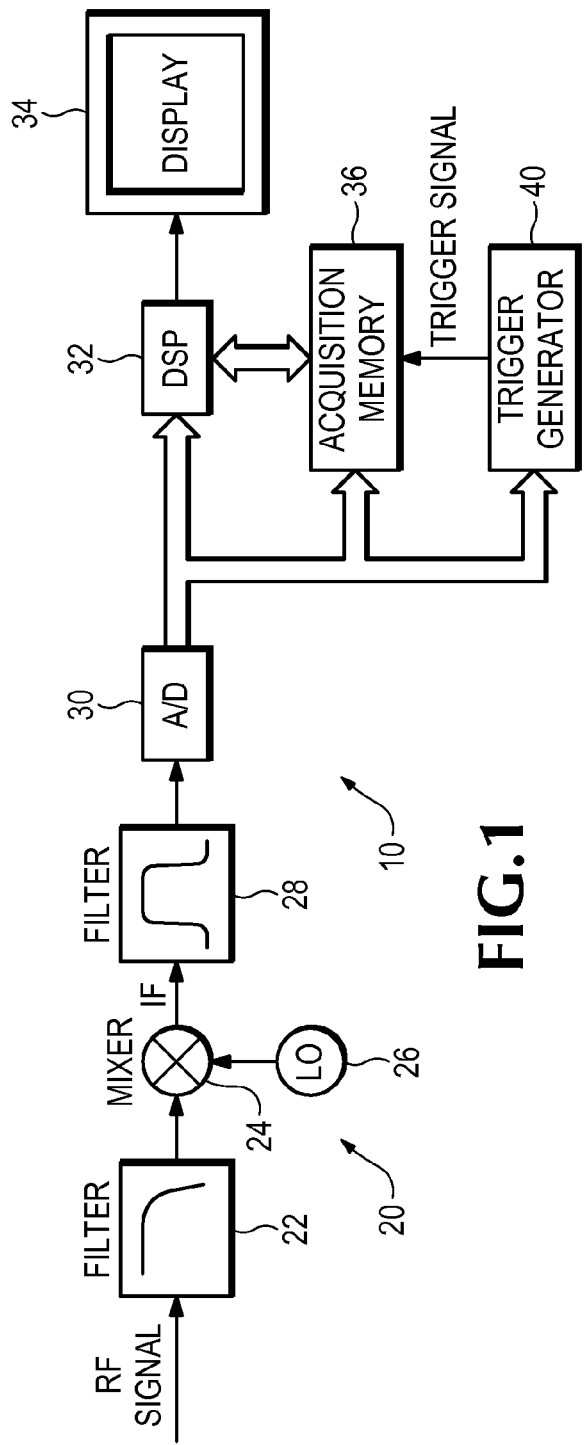
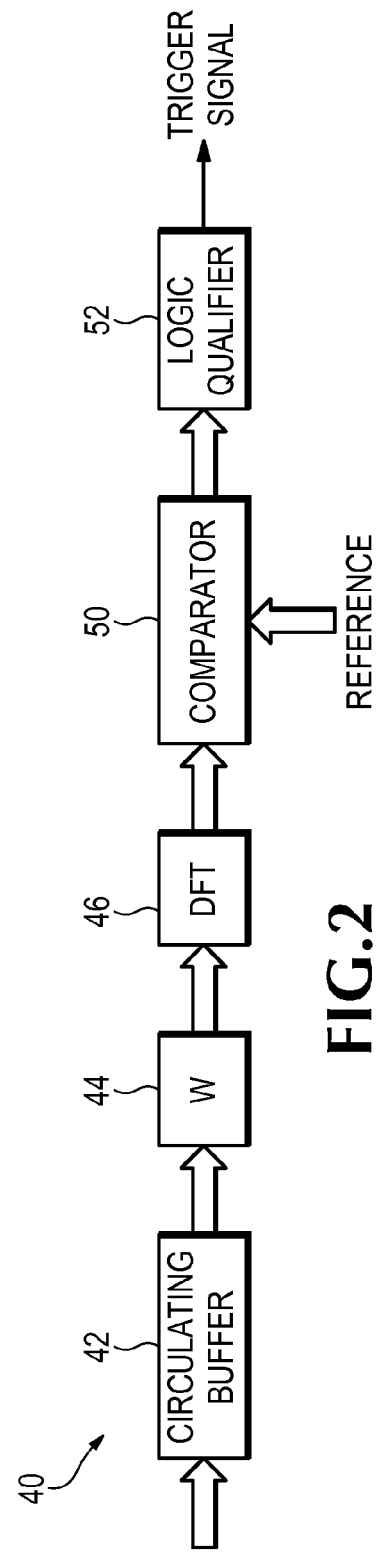
FIG.1
FIG.2

LOGICAL TRIGGERING IN THE FREQUENCY DOMAIN

FIELD OF THE INVENTION

The present invention relates to test and measurement instruments, and more particularly to frequency domain triggers.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These instruments seamlessly capture RF signals so that, unlike conventional swept spectrum analyzers and vector signal analyzers, no data is missed within a specified bandwidth.

These instruments have the capability to trigger on events which occur in the frequency domain. This capability, known as a "frequency mask trigger," is described in U.S. Pat. No. 5,103,402. The frequency mask trigger calculates the frequency spectrum of real-time data provided by the instrument's receiver system and then compares the frequency spectrum to a user-defined frequency mask. When the frequency spectrum violates the frequency mask, a trigger signal is generated which causes a seamless block of data representing the received RF signal to be stored containing the triggering event as well what happened immediately before and immediately after the triggering event. In this manner the frequency mask trigger waits for a single specific spectral event to occur.

SUMMARY OF THE INVENTION

In some instances, a user may want to trigger based on a logical combination of two or more areas of a frequency mask. For example, consider a system in which two signals are used, with each signal being at a different frequency. Either signal may be present at any given time, but it is only an error condition if both signals are present at the same time. A conventional frequency mask trigger cannot detect this error condition, that is, it cannot generate a trigger signal only when both signals are present at the same time, because a conventional frequency mask trigger generates a trigger signal as soon as any point of the frequency mask is violated. A conventional frequency mask trigger does not have the capability to trigger only when the frequency mask is violated at two different locations.

What is desired is a frequency mask trigger capable of triggering based on a logical combination of two or more areas of a frequency mask.

Accordingly, embodiments of the present invention provide a frequency mask trigger capable of triggering based on a logical combination of two or more areas of a frequency mask. A frame of digital data representing an input signal is transformed into a frequency spectrum having a plurality of frequency bins, with each frequency bin having a power amplitude value. A frequency mask is defined having a plurality of reference power levels, one reference power level being associated with each frequency bin. Two or more areas of the frequency mask are defined, with each mask area corresponding to one or more of the frequency bins. A violation status is determined for each mask area by comparing all of the power amplitude values within each mask area to the associated reference power level. If any of the power amplitude values within the mask area violates the associated reference power level, then the entire mask area is deemed to be violated. A trigger signal is generated when a logical combination of the violation statuses of the mask areas is satisfied.

The objects, advantages, and other novel features of the present invention are apparent from the following detailed description when read in conjunction with the appended claims and attached drawings.

BRIEF DESCRIPTION OF THE DRAWINGS

FIG. 1 depicts a simplified, high-level block diagram of a real-time spectrum analyzer.

FIG. 2 depicts a simplified, high-level block diagram of a trigger generator according to an embodiment of the present invention.

DETAILED DESCRIPTION OF THE INVENTION

Figure 3:
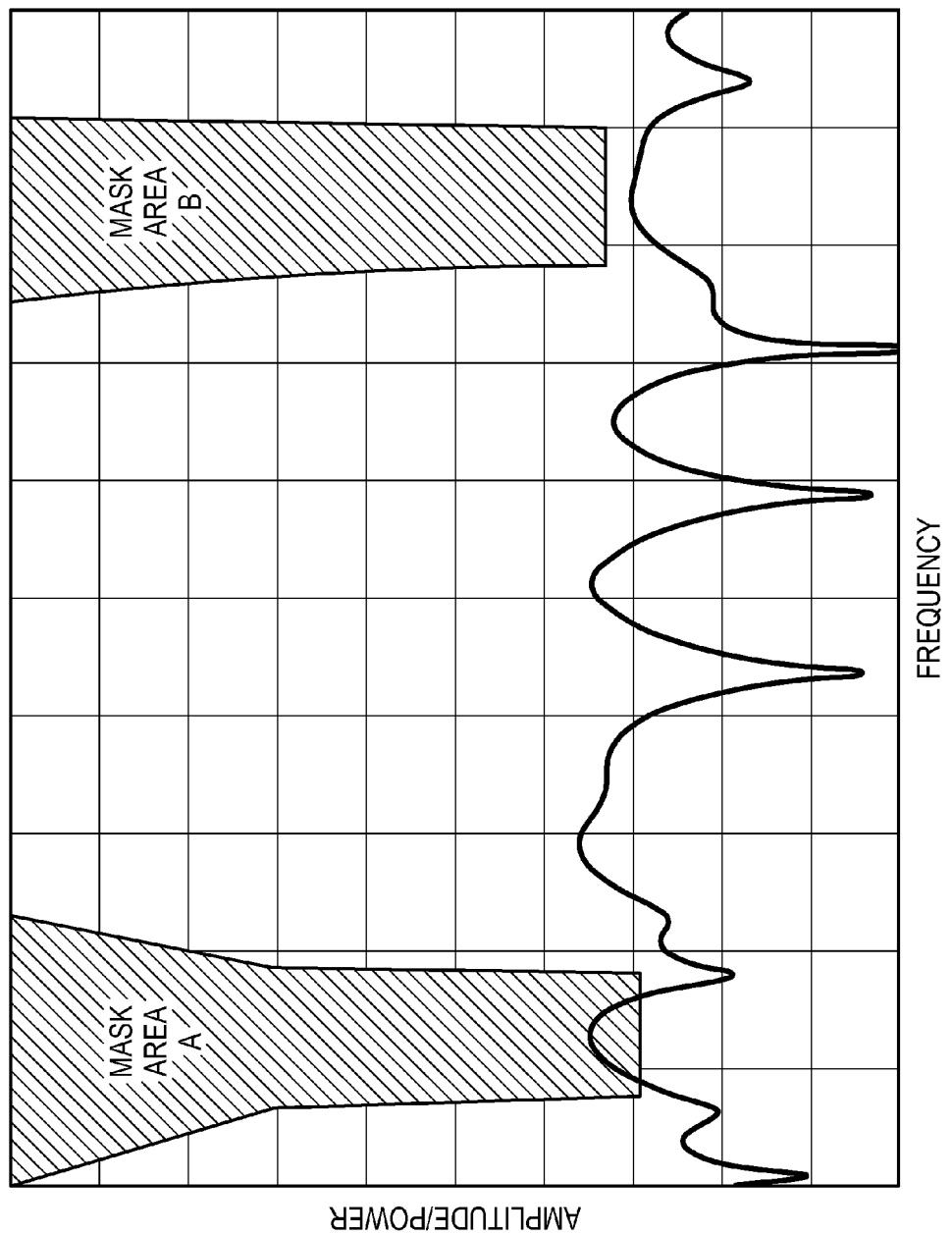
FIG. 3 depicts a frequency mask having two mask areas.

Referring now to FIG. 1, a real-time spectrum analyzer 10 is shown having an input processor 20 for receiving a radio frequency (RF) input signal. The input processor 20 includes an optional image reject filter 22 followed by a mixer 24 that converts the filtered input signal to an intermediate frequency (IF) signal using a local oscillator (LO) 26. The image reject filter 22 may be implemented using a lowpass filter, a bandpass filter, or a highpass filter. The IF signal is passed through a bandpass filter 28 and then input to an analog-to-digital (A/D) converter 30 to provide a digital signal for further processing. The digital signal is input to a digital signal processor (DSP) 32 for real-time processing for display on a display device 34, such as in the form of a spectrogram as described in U.S. Pat. No. 4,870,348. The digital signal also is input to an acquisition memory 36 and to a trigger generator 40. In some embodiments, the acquisition memory 36 may be implemented using a circulating memory. When the trigger generator 40 detects a trigger event, a trigger signal is generated that causes the acquisition memory 36 to store a seamless block of digital data from the digital signal for subsequent processing by the DSP 32 or for offloading to another processor (not shown) for non-real-time post-processing.

Referring now to FIG. 2, a trigger generator 40 according to an embodiment of the present invention is shown having a circulating buffer 42 for storing digital data representing the digital signal. In one embodiment, circulating buffer 42 may be implemented as a part of acquisition memory 36. In another embodiment, circulating buffer 42 may be implemented as a separate memory. A frame of digital data is read from circulating buffer 42 and windowed by a windowing function (W) 44 such as a Blackman-Harris window. The windowed frame is converted to the frequency domain using a Discrete Fourier transform (DFT) 46 to produce a frequency spectrum having a plurality of frequency bins, with each frequency bin having a power amplitude value. A frequency mask is defined by the user having a plurality of reference power levels, one reference power level being associated with each frequency bin. Two or more areas of the frequency mask are also defined by the user, with each mask area corresponding to one or more of the frequency bins.

A comparator 50 compares each of the power amplitude values within each frequency spectrum to the associated reference power levels and produces a plurality of output signals, with each output signal indicating whether a particular power amplitude value violates an associated reference power level. "Violate" means that the power amplitude value is either greater than or less than the associated reference power level depending on whether the user defines a trigger slope as "positive" or "negative." The plurality of output signals from the comparator 50 are input to a logic qualifier 52. The logic qualifier 52 determines a violation status for each mask area by examining the output signals of the comparator 50 that correspond to each mask area. If any of the output signals that correspond to a particular mask area indicate that a particular frequency bin is violated, then the entire mask area is deemed to be violated. The logic qualifier 52 generates a trigger signal when a user-specified logical combination of the violation statuses of the mask areas is satisfied. The logical combination may comprise any combination of logical functions such as AND, OR, XOR, NOT, NAND, NOR, XNOR, and so on.

It will be appreciated that various modifications may be made to the trigger generator 40 without departing from the spirit and scope of the invention. For example, in an alternative embodiment, the comparator 50 does not compare all of the power amplitude values within each frequency spectrum, but instead compares only those power amplitude values that correspond to mask areas. In that case, the comparator 50 generates a plurality of output signals that indicate the violation status of the mask areas, and the logic qualifier 52 generates the trigger signal based on a logical combination of those output signals.

In operation, a user may specify the logical combination of the violation statuses of the mask areas that must be satisfied in order to generate a trigger signal. For example, given the frequency mask shown in FIG. 3 having two user-defined mask areas A and B, a user may specify that the trigger signal is to be generated when the input signal violates mask areas A AND B, A OR B, A XOR B, A NOT B, and so on.

Figure 4:
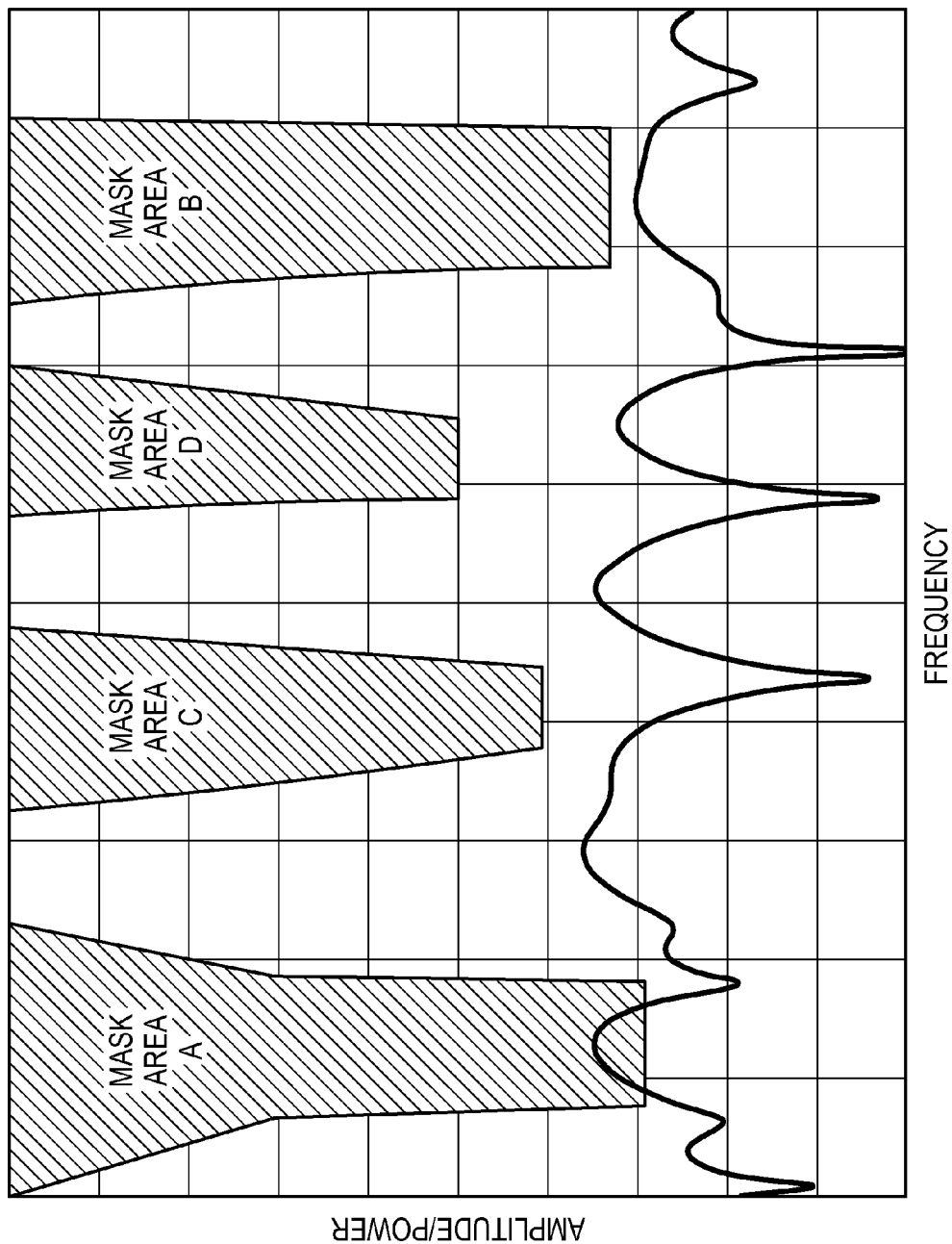
FIG. 4 depicts a frequency mask having four mask areas.

More complex logical combinations may be used if more mask areas are added. For example, given the frequency mask shown in FIG. 4 having four user-defined mask areas A, B, C, and D, a user may specify that the trigger signal is to be generated when the input signal violates mask areas (A AND B) OR (C AND D). It will be appreciated that numerous other logical combinations are also possible. For example, the user may specify that the trigger signal is to be generated when the input signal violates mask areas (A OR (B AND C AND D)), ((A AND B AND NOT C) OR D), (A XOR (B XOR (C XOR D))), and so on.

The embodiments described above use a discrete Fourier transform to convert a time domain signal into a frequency spectrum. Alternatively, other transforms may be used such as a Hartley transform or a chirp-Z transform. Additionally, non-transform-based techniques may be used such as a bank of parallel filters, including finite impulse response filters and continuous-time analog filters.

In various embodiments, the trigger generator 40 may be implemented in hardware, software, or a combination of the two, and may comprise a general purpose microprocessor, a digital signal processor (DSP), an application specific integrated circuit (ASIC), a field-programmable gate array (FPGA), or the like.

Although many of the parameters described above are described as being "user-specified" or "user-defined," it will be appreciated that in other embodiments, those parameters may alternatively be determined by a standard or automatically determined by a test and measurement instrument.

Although embodiments of the present invention have application to real-time spectrum analyzers in particular, it will be appreciated that any test and measurement instrument that acquires data in response to a trigger signal may advantageously use a frequency mask trigger capable of triggering based on a logical combination of two or more areas of a frequency mask.

It will be appreciated from the foregoing that the present invention represents a significant advance in the field of frequency domain triggering. Although a specific embodiment of the invention has been illustrated and described for purposes of illustration, it will be understood that various modifications may be made without departing from the spirit and scope of the invention. Accordingly, the invention should not be limited except as by the appended claims.

What is claimed is:

1. A test and measurement instrument comprising:
   an input processor configured to receive an input signal and produce a digital signal;
   a user interface configured to receive user input specifying a user-specified logic function, from a plurality of pre-defined logic functions, that defines a logical relationship between a first area of a frequency mask and a second area of the frequency mask, the first area of the frequency mask corresponding to a first frequency bin and the second area of the frequency mask corresponding to a second frequency bin, wherein the plurality of pre-defined logic functions include at least one of AND, NOT, XOR, NAND, NOR, and XNOR;
   a trigger generator configured to generate a trigger signal based on the user-specified logic function; and
   an acquisition memory configured to store a block of digital data from the digital signal in response to the trigger signal.

2. The method as recited in claim 1, wherein the plurality of pre-defined logic functions include at least two of AND, OR, NOT, XOR, NAND, NOR, or XNOR.

3. The test and measurement instrument as recited in claim 1, wherein the trigger generator comprises:
   a time-to-frequency converter configured to convert a frame of digital data from the digital signal into a frequency spectrum including the first and second frequency bins the first frequency bin having a first power amplitude value and the second frequency bin having a second power amplitude value;
   a comparator configured to generate:
      a first output signal indicating whether the first power amplitude value violates a first reference power level associated with the first area of the frequency mask, and
      a second output signal indicating whether the second power amplitude value violates a second reference power level associated with the second area of the frequency mask; and
   a logic qualifier configured to generate the trigger signal based on the first and second output signals satisfying the user-specified logic function.

4. The test and measurement instrument as recited in claim 3, wherein the trigger generator further comprises a windowing function for windowing the frame of digital data.

5. The test and measurement instrument as recited in claim 3, wherein the time-to-frequency converter comprises a time-to-frequency transform, wherein the time-to-frequency transform is a discrete Fourier transform, a discrete Hartley transform, or a chirp-Z transform.

6. The test and measurement instrument as recited in claim 3, wherein the time-to-frequency converter comprises a bank of parallel filters that includes finite impulse response filters, continuous time analog filters, or any combination thereof.

7. The test and measurement instrument as recited in claim 1, wherein the input processor comprises:
 a mixer configured to mix the input signal with a local oscillator signal to produce an intermediate frequency signal;
 a bandpass filter configured to filter the intermediate frequency signal to produce a filtered intermediate frequency signal; and
 an analog-to-digital converter configured to digitize the filtered intermediate frequency signal to produce the digital signal.

8. The test and measurement instrument as recited in claim 7, wherein the input processor further comprises an image reject filter configured to filter the input signal.

9. A method of generating a trigger signal, the method comprising:
 receiving an input signal and producing a digital signal;
 receiving user input specifying a user-specified logic function, from a plurality of pre-defined logic functions, that defines a logical relationship between a first area of a frequency mask and a second area of the frequency mask, the first area of the frequency mask corresponding to a first frequency bin and the second area of the frequency mask corresponding to a second frequency bin, wherein the plurality of pre-defined logic functions include at least one of AND, NOT, XOR, NAND, NOR, and XNOR;
 generating a trigger signal based on the user-specified logic function; and
 storing a block of digital data from the digital signal in response to the generated trigger signal.

10. The method as recited in claim 9, wherein the plurality of pre-defined logic functions include at least two of AND, OR, NOT, XOR, NAND, NOR, or XNOR.

11. The method as recited in claim 10, wherein the receiving the input signal step further comprises:
 mixing the input signal with a local oscillator signal to produce an intermediate frequency signal;
 filtering the intermediate frequency signal to produce a filtered intermediate frequency signal; and
 digitizing the filtered intermediate frequency signal to produce the digital signal.

12. The method as recited in claim 9, wherein the trigger signal generation step further comprises:
 converting a frame of digital data from the digital signal into a frequency spectrum including the first and second frequency bins, the first frequency bin having a first power amplitude value and the second frequency bin having a second power amplitude value;
 generating a first output signal indicating whether the first power amplitude value violates a first reference power level associated with the first area of the frequency mask;
 generating a second output signal indicating whether the second power amplitude value violates a second reference power level associated with the second area of the frequency mask; and
 generating the trigger signal based on the first and second output signals satisfying the user-specified logic function.

13. A test and measurement instrument comprising:
 an input processor structured to receive an input signal and produce a digital signal;
 a user interface to receive user input specifying a user-specified logic function, from a plurality of pre-defined logic functions, that defines: a logical relationship between a first violation status of a first area of a frequency mask and a second violation status of a second area of the frequency mask, the first area of the frequency mask corresponding to a first frequency bin of the digital signal, and the second area of the frequency mask corresponding to a second frequency bin of the digital signal, wherein the first and second frequency bins are different from one another, wherein the plurality of pre-defined logic functions include at least one of AND, NOT, XOR, NAND, NOR, and XNOR;
 a comparator structured to generate:
  a first output signal indicating the first violation status, wherein the first violation status identifies whether a first power amplitude value of the first frequency bin violates a first reference power level associated with the first area of the frequency mask, and
  a second output signal indicating the second violation status, wherein the second violation status identifies whether a second power amplitude value of the second frequency bin violates a second reference power level associated with the second area of the frequency mask;
 a logic qualifier structured to generate a trigger signal based on a determination that the first and second output signals satisfy the user-specified logic function; and
 an acquisition memory to store a block of digital data from the digital signal in response to the trigger signal.

14. The test and measurement instrument as recited in claim 13, wherein the plurality of pre-defined logic functions include at least two of AND, OR, NOT, XOR, NAND, NOR, and XNOR.

15. The test and measurement instrument as recited in claim 13, wherein the input processor comprises:
 a mixer for mixing the input signal with a local oscillator signal to produce an intermediate frequency signal;
 a bandpass filter for filtering the intermediate frequency signal to produce a filtered intermediate frequency signal; and
 an analog-to-digital converter for digitizing the filtered intermediate frequency signal to produce the digital signal.

16. The test and measurement instrument as recited in claim 13, wherein the logic qualifier further comprises a windowing function for windowing a frame of the digital data.

* * * * *